United States Patent
Shinomoto et al.

(10) Patent No.: US 9,806,594 B2
(45) Date of Patent: Oct. 31, 2017

(54) DRIVE DEVICE FOR POWER CONVERTER AND DRIVING METHOD OF POWER CONVERTER

(75) Inventors: Yosuke Shinomoto, Tokyo (JP); Michio Yamada, Tokyo (JP); Kazunori Hatakeyama, Tokyo (JP); Takuya Shimomugi, Tokyo (JP)

(73) Assignee: MITSUBISHI CORPORATION, Tokyo (JP)

( * ) Notice: Subject to any disclaimer, the term of this patent is extended or adjusted under 35 U.S.C. 154(b) by 85 days.

(21) Appl. No.: 14/355,634

(22) PCT Filed: Nov. 2, 2011

(86) PCT No.: PCT/JP2011/075320
§ 371 (c)(1),
(2), (4) Date: May 1, 2014

(87) PCT Pub. No.: WO2013/065150
PCT Pub. Date: May 10, 2013

(65) Prior Publication Data
US 2014/0286069 A1 Sep. 25, 2014

(51) Int. Cl.
*H03K 17/04* (2006.01)
*H02M 1/08* (2006.01)
(Continued)

(52) U.S. Cl.
CPC ........ *H02M 1/08* (2013.01); *H03K 17/04123* (2013.01); *H03K 17/161* (2013.01);
(Continued)

(58) Field of Classification Search
CPC ............. H03K 2017/06; H03K 17/063; H03K 2017/066; H03K 17/04; H02M 3/156
(Continued)

(56) References Cited

U.S. PATENT DOCUMENTS 4,967,109 A 10/1990 Steigerwald
5,369,308 A * 11/1994 Schoofs ............. H03K 17/0822
327/374
(Continued)

FOREIGN PATENT DOCUMENTS

JP 02-179262 A 7/1990
JP 03-093457 A 4/1991
(Continued)

OTHER PUBLICATIONS

Office action dated Sep. 17, 2014 in the corresponding JP Application No. 2013-541543 (and English translation).
(Continued)

*Primary Examiner* — Gary L Laxton
(74) *Attorney, Agent, or Firm* — Posz Law Group, PLC

(57) ABSTRACT

A drive device driving a power converter that includes a switching element formed from a wide bandgap semiconductor, includes a PWM-signal output unit that generates a drive signal that drives the switching element with PWM; an on-speed reducing unit that, when the switching element is changed from off to on, reduces a change rate of the drive signal; and an off-speed improving unit that, when the switching element is changed from on to off, draws charge from the switching element at a high speed and with a charge drawing performance higher than that at a time when the switching element is changed from off to on.

15 Claims, 6 Drawing Sheets

(51) Int. Cl.
    H03K 17/0412    (2006.01)
    H03K 17/16      (2006.01)
    H02M 3/158      (2006.01)
    H02M 1/00       (2006.01)
(52) U.S. Cl.
    CPC .......... *H03K 17/163* (2013.01); *H02M 3/158* (2013.01); *H02M 2001/0029* (2013.01); *Y02B 70/1483* (2013.01)
(58) Field of Classification Search
    USPC ........ 323/282, 289; 327/377, 378, 109, 375, 327/376, 380, 381
    See application file for complete search history.

(56)        References Cited

U.S. PATENT DOCUMENTS

| | | | | |
|---|---|---|---|---|
| 5,736,890 | A * | 4/1998 | Yee | H02M 7/217 327/423 |
| 6,094,087 | A * | 7/2000 | He | H02M 1/4225 327/376 |
| 6,208,535 | B1 | 3/2001 | Parks | |
| 6,819,149 | B2 * | 11/2004 | Shirasawa | H03K 17/162 327/112 |
| 6,903,597 | B2 * | 6/2005 | Tai | H03K 17/0828 327/108 |
| 8,182,245 | B2 | 5/2012 | Maeda et al. | |
| 8,310,296 | B2 * | 11/2012 | Kuroda | H03K 17/166 327/108 |
| 2010/0176783 | A1 | 7/2010 | Tagome | |
| 2010/0232983 | A1 | 9/2010 | Maeda et al. | |
| 2011/0221480 | A1 | 9/2011 | Ikeda | |

FOREIGN PATENT DOCUMENTS

| | | |
|---|---|---|
| JP | 05-161343 A | 6/1993 |
| JP | 2002-300016 A | 10/2002 |
| JP | 2004-088886 A | 3/2004 |
| JP | 2005-312117 A | 11/2005 |
| JP | 2007-282326 A | 10/2007 |
| JP | 2008-086107 A | 4/2008 |
| JP | 2008-169699 A | 7/2008 |
| JP | 2009-159707 A | 7/2009 |
| JP | 2009-225648 A | 10/2009 |
| JP | 2010-051165 A | 3/2010 |
| JP | 2010-252451 A | 11/2010 |
| JP | 2011-160659 A | 8/2011 |
| WO | 2008/155917 A1 | 12/2008 |

OTHER PUBLICATIONS

International Search Report of the International Searching Authority dated Jan. 17, 2012 for the corresponding international application No. PCT/JP2011/075320 (with English translation).
Extended European Search Report dated Jun. 18, 2015 in the corresponding EP application No. 11874969.6.
Office Action dated Oct. 16, 2015 in the corresponding CN application No. 201180074522.0 (with partial English translation).
Japanese Office Action dated May 31, 2016 in the corresponding JP application No. 2015-103542. (English translation attached).
Japanese Office Action dated Nov. 22, 2016 in the corresponding JP application No. 2015-103542. (English translation attached).
Office Action dated Aug. 8, 2017 issued in corresponding JP patent application No. 2015-103542. (and English translation).

* cited by examiner (a)

(b)

DRIVE DEVICE FOR POWER CONVERTER AND DRIVING METHOD OF POWER CONVERTER

CROSS REFERENCE TO RELATED APPLICATION

This application is a U.S. national stage application of International Patent Application No. PCT/JP2011/075320 filed on Nov. 2, 2011.

TECHNICAL FIELD

The present invention relates to a drive device for a power converter and a driving method of a power converter.

BACKGROUND

A technology for driving switching elements (semiconductor elements) used in power converters or the like includes a technology of forming a gate drive circuit with a simple configuration composed of a small number of components by actively using the gate capacitance of the semiconductor element (for example, see Patent Literature 1 described below). With this technology, the gate drive circuit, in which a capacitor and a resistor are connected in parallel, is inserted between the gate and the switching output circuit such that the relationship between the gate capacitance Cis of the semiconductor element and the capacitance Cg satisfies (switching-control-circuit output voltage at the time of turn-on)×(Cg/(Cg+Cis))≥(threshold voltage), and the resistor of the gate drive circuit supplies to the gate of the gate-drive-type semiconductor element with a current appropriate for the conductivity modulation. Accordingly, the output voltage of the switching control circuit is appropriately divided and applied to the gate terminal of the semiconductor element, thereby realizing a gate drive circuit with a simple circuit configuration composed of a small number of components.

Moreover, there is a technology for reducing the reverse recovery current of a freewheeling diode by using a circuit that applies a voltage lower than the applied voltage in a steady state for a certain period of time set by a timer at the time of turn-on or by using switching elements having different switching times as a pair of switching elements in the output stage of the gate drive circuit and by setting a voltage to be applied to the gate of the semiconductor element relatively low (for example, see Patent Literature 2 described below).

Moreover, there is a technology in which the gate voltage gradually increases at the time of turn-on due to the capacitor connected between the gate and emitter; however, at the time of turn-off, the capacitor does not function and thus dv/dt does not become gradual, thereby preventing the switching loss from being increased (for example, see Patent Literature 3 described below).

PATENT LITERATURE

Patent Literature 1: Japanese Patent Application Laid-open No. 2010-51165
Patent Literature 2: Japanese Patent Application Laid-open No. H02-179262
Patent Literature 3: Japanese Patent Application Laid-open No. 2002-300016

Technical Problem

In the technology in Patent Literature 1 described above, the switching loss is reduced by raising the gate voltage quickly and increasing the switching speed. In contrast, in the technology in Patent Literature 2 described above, the reverse blocking capability of the freewheeling diode is recovered by turning on the semiconductor element with a relatively low voltage at the time of turn-on, in other words, switching is performed gradually, thereby reducing noise. Thus, the technology in Patent Literature 1 described above and the technology in Patent Literature 2 described above conflict with each other; therefore, there is a problem in that a reduction of the switching loss and a reduction of the switching noise cannot be achieved at the same time.

Moreover, the technology disclosed in Patent Literature 3 described above resolves the problem of the increase in the switching loss at the time of turn-off by gradually increasing the gate voltage only at the time of turn-on. However, this technology is a solution for a switching element made of silicon, which is the conventional material. With a switching element made of silicon, it is not necessary to increase the turn-on speed and the ringing noise caused by the equivalent capacitance of the switching element itself does not occur. Therefore, for example, when a switching element, such as a wide bandgap semiconductor, for which it is necessary to suppress the ringing noise while performing high-speed switching, is used, the ringing noise cannot be reduced.

SUMMARY

The present invention has been achieved in view of the above and an object of the present invention is to obtain a drive device for a power converter and a driving method of a power converter capable of suppressing ringing at the time of turn-on and turn-off when high-speed switching is performed.

In order to solve the above problems and achieve the object, a drive device for a power converter, the drive device driving the power converter that includes a switching element formed from a wide bandgap semiconductor, the device including a PWM-signal output unit that generates a drive signal that drives the switching element with PWM; an on-speed reducing unit that, when the switching element is changed from off to on, reduces a change rate of the drive signal; and an off-speed improving unit that, when the switching element is changed from on to off, draws charge from the switching element at a high speed and with a charge drawing performance higher than that at a time when the switching element is changed from off to on.

According to the present invention, an effect is obtained where it is possible to suppress ringing at the time of turn-on and turn-off.

DETAILED DESCRIPTION

Exemplary embodiments of a drive device for a power converter and a driving method of a power converter according to the present invention will be explained below in detail with reference to the drawings. This invention is not limited to the embodiments.

Embodiment

Figure 1:
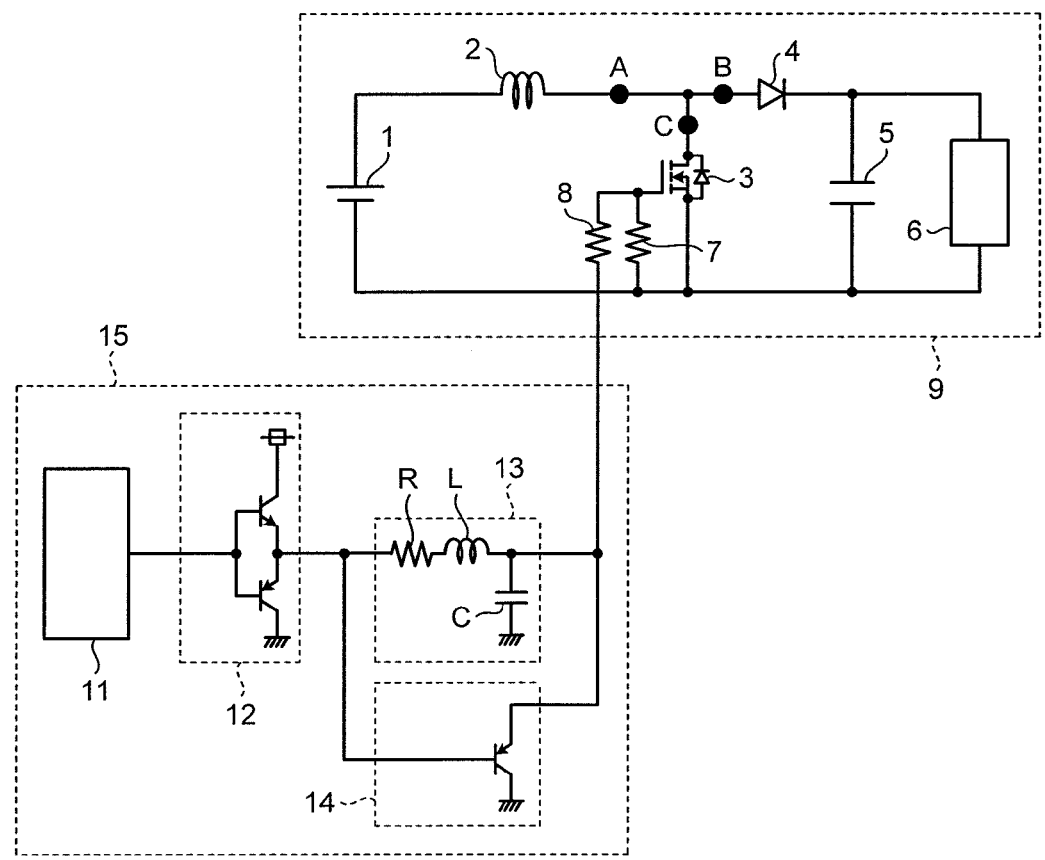
FIG. 1 is a diagram illustrating a configuration example of a drive device for a power converter according to the present invention.

FIG. 1 is a diagram illustrating a configuration example of a drive device for a power converter according to the present invention. A drive device (drive device) 15 of the power converter in the present embodiment drives a power converter 9. The power converter 9 includes a DC power supply 1, a reactor 2, a switching element 3, a reverse-blocking diode 4, a smoothing capacitor 5, a load 6, and resistors 7 and 8. The drive device 15 includes a PWM-signal output unit 11, a gate driving unit 12, an on-speed reducing unit 13, and an off-speed improving unit 14. The configuration of the power converter 9 is an example and is not limited to the configuration in FIG. 1 as long as the configuration is such that a wide bandgap semiconductor is used as a switching element.

The power converter 9 and the drive device 15 in the present embodiment are used, for example, in a compressor in an air conditioner or the like. When the power converter 9 and the drive device 15 are used in a compressor or the like, the load 6 is, for example, an inductive load. The power converter 9 and the drive device 15 in the present embodiment are not limited to this and can be used in general home appliances, such as refrigerators, dehumidifiers, heat pump water heaters, showcases, and vacuum cleaners, in addition to freezers and washer-dryers. Moreover, the power converter 9 and the drive device 15 can be used in fan motors, ventilation fans, hand dryers, electromagnetic induction heating cookers, and the like. Furthermore, the power converter 9 and the drive device 15 can be used in motor drive inverters for industrial equipment, such as elevators and escalators, motor drive inverters for factory equipment, inverters for electric railways, and electric vehicles and hybrid vehicles, in addition to the home appliances.

The switching element 3 is formed from a semiconductor referred to as a wide bandgap semiconductor. A wide bandgap semiconductor is made of a GaN (gallium nitride) material, an SiC (silicon carbide) material, or other materials, such as diamond. A wide bandgap semiconductor is a semiconductor that has attracted attention as a new semiconductor device for having characteristics, such as high-speed operation, low loss, and improved heat resistance.

On the other hand, due to innovations in the materials and raw materials for semiconductors, the performance of switching elements has improved by using the wide bandgap semiconductors described above, and particularly, the operation speed of the switching elements has increased dramatically; therefore, a new problem has arisen. In the conventional technologies before the high-speed switching was enabled, there were problems due to the effect of wiring impedance; however, it was possible to take measures against this problem. In contrast, when the high-speed switching is enabled, the measures conventionally taken cannot be applied and the effect of wiring impedance is a major issue.

Figure 2:
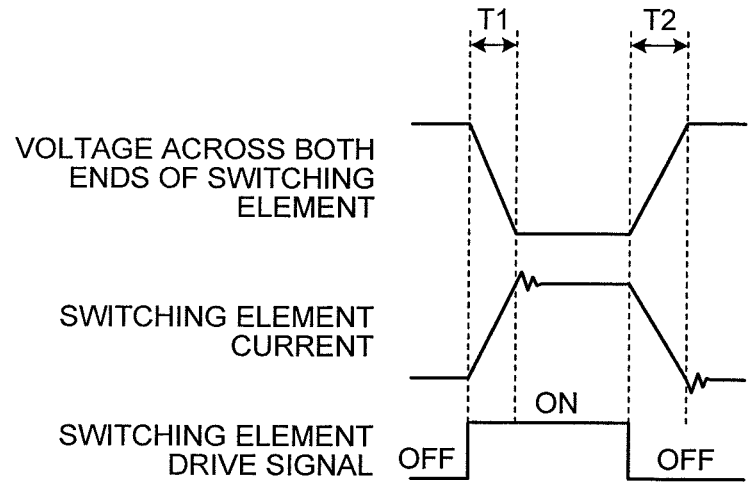
FIG. 2 is a diagram illustrating a comparison between a wide bandgap semiconductor and a conventional silicon semiconductor.
Figure 2:
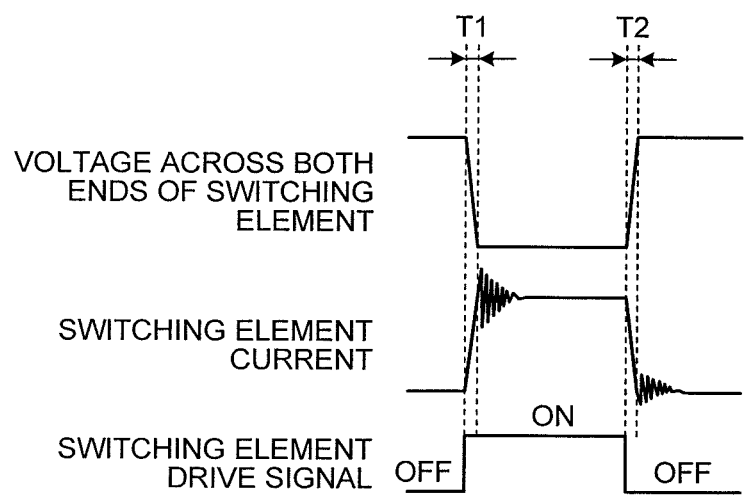

FIG. 2 is a diagram illustrating a comparison between a wide bandgap semiconductor and a conventional silicon semiconductor. FIG. 2(*a*) illustrates an operation waveform when a conventional silicon semiconductor is used as a switching element and FIG. 2(*b*) illustrates an operation waveform when a wide bandgap semiconductor is used as a switching element. In both diagrams, the horizontal axis indicates the time, and a voltage across both ends of a switching element, a switching-element current, and a switching-element drive current are illustrated in sequence starting from the top.

When a wide bandgap semiconductor is used, transition times T1 and T2 due to switching become shorter than those in the case where a silicon semiconductor is used; therefore, high-speed switching can be realized and thus high-frequency driving can be performed. Because the transition time is short in the case of a wide bandgap semiconductor, the switching loss does not occur even if high-frequency driving is performed. Therefore, a wide bandgap semiconductor is said to be a semiconductor suitable for high-frequency driving.

On the other hand, although not illustrated, wiring inductance components are present at point A, point B, and point C in FIG. 1. These inductance components are designed to be extremely small, i.e., as small as a few nH and cause less of a problem if a conventional silicon semiconductor is used. However, because the wiring inductance is L components, when the frequency increases, the impedance represented by $j\omega L$ increases, where $\omega$ is the angular frequency ($\omega=2\pi f$: f is the frequency) and j is the imaginary unit.

Figure 3:
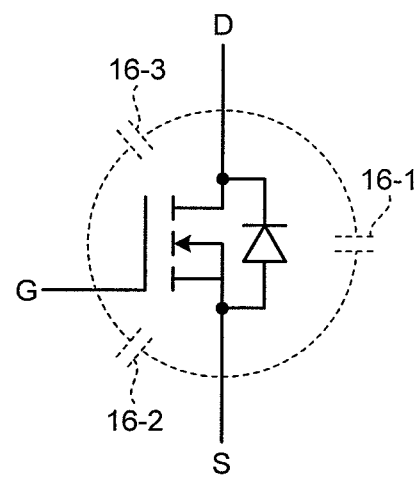
FIG. 3 is a diagram illustrating the concept of stray capacitance in a wide bandgap semiconductor.

In the case of a wide bandgap semiconductor, the capacitance component referred to as stray capacitance between the terminals of the switching element increases by one to two orders of magnitude compared with that in a conventional silicon semiconductor. FIG. 3 is a diagram illustrating the concept of stray capacitance in a wide bandgap semiconductor. Capacitances 16-1 to 16-3 illustrated by dotted lines in FIG. 3 are capacitances that are stray capacitance and do not exist in the circuit diagram.

Furthermore, in the case of a wide bandgap semiconductor, LC resonance due to the capacitances referred to as stray capacitance and the wiring inductances occurs as ringing at a higher frequency than that in the power converter composed of a conventional silicon semiconductor as illustrated in FIG. 2. In the case of a conventional silicon semiconductor, a recovery current is generated due to a delay in the recovery of the reverse blocking. In contrast, in the case of a wide bandgap semiconductor, the reverse recovery is fast and thus a recovery current is not generated; however, the equivalent capacitance of the semiconductor increases and thus ringing occurs due to the LC resonance.

Particularly, a ringing current that is superimposed on the current flowing in the switching element behaves as a noise generating source and the electric field radiates from the circuit due to the ringing or is conducted to the AC power supply. Therefore, it is necessary to reduce noise by taking measures, such as extending the transition times T1 and T2 in the switching illustrated in FIG. 2; however, it is impossible to take advantage of the characteristics of a wide bandgap semiconductor, i.e., high-speed switching, by simply extending the transition times.

Thus, in the present embodiment, the following operation is performed so as to realize a reduction of the noise due to ringing caused by the LC resonance of the wiring inductances and the equivalent capacitance of the wide bandgap semiconductor while taking advantage of the characteristics of the wide bandgap semiconductor, i.e., high-speed switching and low loss.

The power converter 9 illustrated in FIG. 1 is typically a step-up DC (Direct Current)/DC power converter. When the switching element 3 is turned on, the DC power supply 1 is short-circuited via the reactor 2 and the switching element 3; therefore, charge is stored in the reactor 2. When the switching element 3 is turned off, the charge stored in the reactor 2 flows into the smoothing capacitor 5 via the reverse-blocking diode 4 and thus the voltage across both ends of the smoothing capacitor 5 increases.

When the switching element 3 made of a wide bandgap semiconductor is turned on, a reverse current flows from the smoothing capacitor 5 through the reverse-blocking diode 4. If the reverse-blocking diode 4 is made of a wide bandgap semiconductor, this reverse current is small and the reverse-blocking diode 4 is turned off. Normally, when the reverse-blocking diode 4 is turned off, the recovery current disappears and noise is not generated; however, the LC resonance due to the equivalent capacitance and the wiring inductances occurs particularly in the path (point B in FIG. 1) through which the current stops flowing.

The LC resonance occurs when an inductance is present between capacitors. Therefore, the equivalent capacitances due to the wide bandgap semiconductors of the reverse-blocking diode 4 and the switching element 3 and the wiring inductances between these equivalent capacitances, i.e., point B and point C in FIG. 1, serve as generating sources of the LC resonance. Noise is generated due to the energy due to the ringing caused by the LC resonance.

Thus, as illustrated in FIG. 1, the drive device 15 in the present embodiment includes the on-speed reducing unit 13 in addition to the PWM-signal output unit 11 and the gate driving unit 12. In the present embodiment, switching is performed with a reduced on-speed so that the LC resonance does not occur without gradually performing switching for reverse recovery of a freewheeling diode or the like as illustrated in Patent Literature 2 described above.

When a stepwise change is supplied to the switching element 3, because the resistance component to be a damping term is small at point B and point C in FIG. 1, the LC resonance continues to vibrate and causes ringing. A resistance component or the like can be inserted in order to suppress this ringing; however, the loss due to a countermeasure component to be inserted occurs and thus it is difficult to take full advantage of the characteristics of a wide bandgap semiconductor. Therefore, it is not desirable to insert a countermeasure component in the power circuit in the power converter 9.

Figure 4:
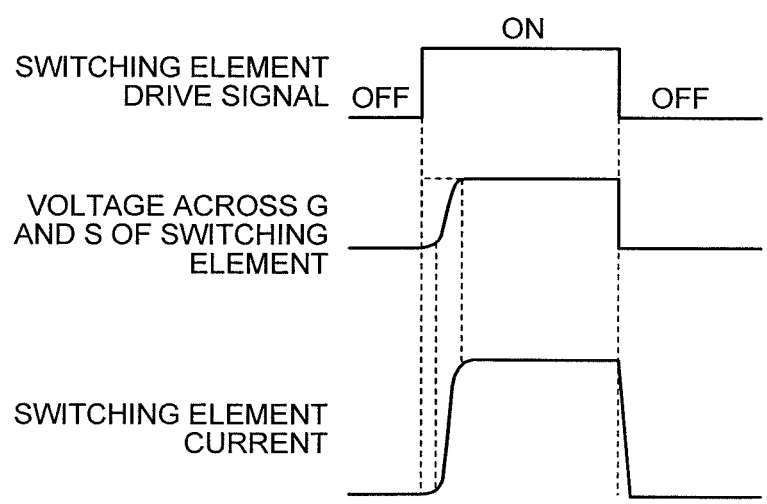
FIG. 4 is a diagram illustrating an operation example of an embodiment.

Accordingly, in the present embodiment, the drive device 15 is configured to perform control such that an operation signal is generated that does not supply a stepwise change to the switching element 3. FIG. 4 is a diagram illustrating an operation example of the embodiment. The PWM-signal output unit 11 generates and outputs a PWM signal for driving the switching element in the power converter 9 in a similar manner to the conventional technologies. The upper stage in FIG. 4 illustrates an example of a PWM signal (drive signal) output from the PWM-signal output unit 11, the middle stage in FIG. 4 illustrates the inter-terminal voltage across G (gate) and S (source) of the switching element 3, and the lower stage in FIG. 4 illustrates the current in the switching element 3.

As illustrated in FIG. 4, the voltage across G and S of the switching element 3 changes corresponding to the rising edge indicating the on-timing of the drive signal of the switching element 3 output from the PWM-signal output unit 11; however, at this point, the voltage across G and S is caused to change gradually only before and after the drive signal changes from off to on, in other words, the voltage across G and S is caused to follow an S-shape as it changes.

Because a wide bandgap semiconductor that operates at a high speed also uses a transistor structure, the current of the switching element 3 rises gradually by applying a voltage across G and S, as illustrated in FIG. 4. Moreover, high-speed switching, which is a characteristic of a wide bandgap semiconductor, is realized after rising; therefore, low-loss switching can be maintained. Furthermore, the switching operation is ended with a gradual change in the last stage of the switching transition time; therefore, the switching element 3 is prevented from changing rapidly in a stepwise manner, thereby interrupting the step response energy that causes ringing. The drive device 15 is configured to perform the turn-on operation as described above, thereby reducing ringing. Accordingly, it is possible to reduce generation of noise that is a problem in a wide bandgap semiconductor.

An example of a circuit that performs the turn-on operation described above is illustrated as the on-speed reducing unit 13 in FIG. 1. The on-speed reducing unit 13 illustrated in FIG. 1 is configured as a low-pass filter composed of LCR (a coil L, a capacitor C, and a resistor R). In other words, the on-speed reducing unit 13 is a circuit that is configured such that the change at the rising and immediately before the end of the transition time is made gradual by using LC and the overshoot that occurs due to the LC resonance is attenuated by R.

Figure 5:
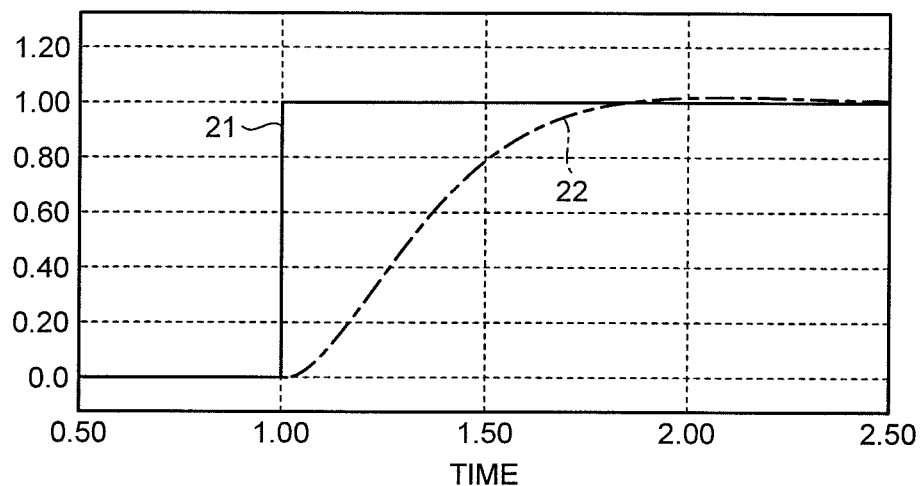
FIG. 5 is a diagram illustrating one example of a step response waveform when an LCR circuit is used as an on-speed reducing unit 13.

FIG. 5 is a diagram illustrating one example of a step response waveform when the LCR circuit is used as the on-speed reducing unit. FIG. 5 illustrates, as an example, a step response waveform when R=15Ω, L=2 mH, and C=22 μF. In FIG. 5, a waveform 21 indicates an input and a waveform 22 indicates an output. It is found that the change becomes gradual (change rate becomes low) immediately after the start and end of the transition time by using the low-pass filter composed of LCR.

Figure 6:
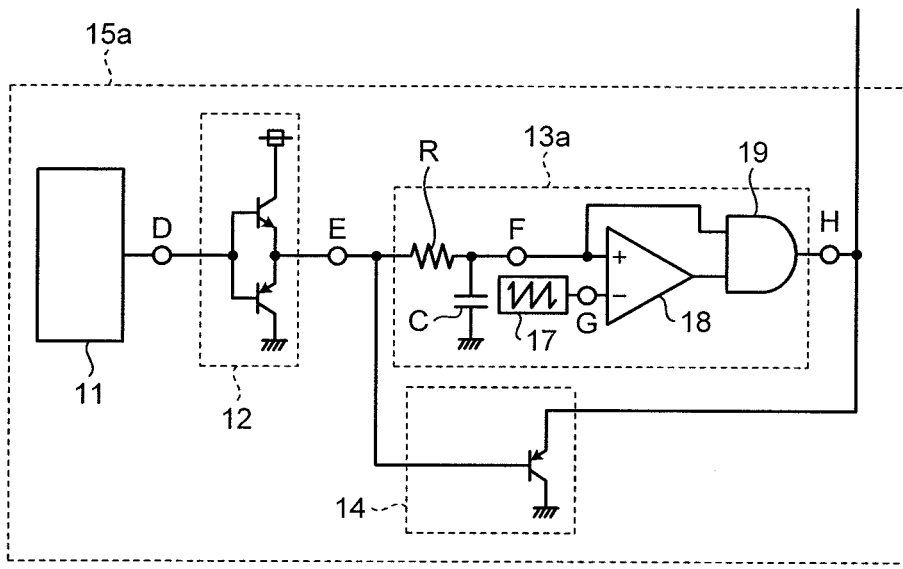
FIG. 6 is a diagram illustrating a configuration example of the on-speed reducing unit that ANDs a predetermined waveform and a drive signal.
Figure 7:
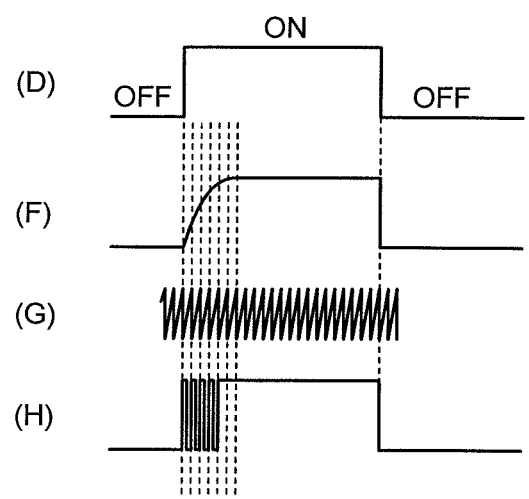
FIG. 7 is a diagram illustrating one example of operation waveforms in the configuration example in FIG. 6.

The configuration example of the on-speed reducing unit 13 illustrated in FIG. 1 realizes the voltage across G and S illustrated in FIG. 4 by using a circuit hardware (H/W); however, the method of implementing the on-speed reducing unit 13 is not limited to the example in FIG. 1. For example, the configuration may be such that a predetermined waveform and the drive signal are ANDed. FIG. 6 is a diagram illustrating a configuration example of an on-speed reducing unit 13a that ANDs a predetermined waveform and the drive signal and FIG. 7 is a diagram illustrating one example of operation waveforms. The waveforms corresponding to the characters (D to H) in brackets in FIG. 7 indicate waveforms at the positions indicated by the corresponding characters in FIG. 6, respectively.

The PWM signal (drive signal) is output from point D in FIG. 6. The waveform at point E in FIG. 6 is the same as the waveform at point D and this waveform is illustrated in (D) in FIG. 7. When the PWM signal is transmitted from point E to point F in FIG. 6, a CR low-pass filter is present; therefore, the waveform is changed to a waveform whose rising edge becomes a gentle curve as illustrated in (F) in FIG. 7. A waveform generating unit 17 generates a predetermined waveform (saw-tooth wave in this embodiment) illustrated in (G) in FIG. 7. A comparator 18 compares the saw-tooth wave generated by the waveform generating unit 17 and the drive signal and outputs a signal and an AND circuit 19 outputs the result ((H) in FIG. 7) obtained by ANDing the signal output from the comparator 18 and the drive signal. The waveform generated by the waveform generating unit 17 is not limited to a saw-tooth wave and may be any waveform as long as the same effect can be obtained.

In the case of the waveform in FIG. 7(H), when a wide bandgap semiconductor is used, the switching element may respond at a high speed; however, if the saw-tooth wave is fast so that the signal can be smoothed by the filter composed of the gate resistor 8 and the equivalent capacitance between G and S of the switching element 3, in this case also, gentle gate driving can be realized. Furthermore, there is not a problem even if the drive signal is output directly to the AND circuit 19 from the PWM-signal output unit 11. The S-shaped rising characteristic can be set more finely by outputting the drive signal directly to the AND circuit 19 from the PWM-signal output unit 11.

As described above, instead of the drive device 15 in FIG. 1, it is possible to use a drive device 15a, which includes the on-speed reducing unit 13a illustrated in FIG. 6 instead of the on-speed reducing unit 13 illustrated in FIG. 1. With the configuration illustrated in FIG. 6, the coil L can be eliminated from the configuration example in FIG. 1; therefore, when the drive device is packaged, it is possible to reduce its size.

Next, an explanation will be given for a case of turn-off. Ringing caused by the LC resonance due to the equivalent capacitance of the switching element 3 occurs also at the time of turn-off. However, the amount of ringing is small compared with that at the time of turn-on. The amount of ringing is different from that at the time of turn-on because a diode is connected in anti-parallel with the switching element 3. The LC resonance generated between the switching element 3 and the reverse-blocking diode 4 is only in the direction from the anti-parallel diode of the switching element 3, the reverse-blocking diode 4, and the smoothing capacitor 5 even if the switching element 3 is turned off; however, a current path is formed and thus a damping effect due to charging to the smoothing capacitor 5 occurs.

Furthermore, because the LC resonance is due to the equivalent capacitance of the switching element 3 and the reverse-blocking diode 4, when charge is drawn (sucked) from the gate of the switching element 3, charge is also drawn from the equivalent capacitance at the same time. Because of this, when a wide bandgap semiconductor is used, the drive device 15 is required to have a higher current capacity at the time of turn-off than that at the time of turn-on. In the present embodiment, a turn-off operation is performed by further using the off-speed improving unit 14, which draws charge from the switching element 3 at a high speed; therefore, charge that must be a generating source of ringing due to the LC resonance is drawn from the equivalent capacitance of the switching element, thereby suppressing ringing.

Accordingly, at the time of turn-off, it is different from the time of turn-on in that it is necessary to provide a drive device that is fast and has a charge drawing capability higher than that at the time turn-on. Therefore, the drive device 15 in FIG. 1 includes the off-speed improving unit 14 that improves the off-speed. The off-speed improving unit 14 in FIG. 1 forms a circuit that draws charge at a high speed by using, for example, a PNP transistor. Accordingly, the off-speed improving unit 14 can achieve a reduction of the switching loss and a reduction of the noise due to ringing at the same time. In the case of such a circuit configuration, the PNP transistor of the off-speed improving unit 14 is connected in parallel with the PNP transistor of the gate driving unit 12 only at the time of turn-off at which charge is drawn as illustrated in FIG. 4; therefore, the switching element current is sharply reduced at the time of turn-off.

If charge is drawn sufficiently by the gate driving unit 12, there is no problem; however, if the gate driving unit 12 has a totem-pole or C (Complementary)-MOS (metal Oxide Semiconductor) structure, it is necessary that the performances of the upper and lower transistors are matched. Accordingly, if the amount of supplied charge increases also on the turn-on side, ringing at the time of turn-on increases. Therefore, it is appropriate that a drive device for a wide bandgap semiconductor includes a circuit that compensates for high-speed only at the time of turn-off, an example of which is the off-speed improving unit 14. Therefore, generation of noise due to high-speed switching can be suppressed without impairing the characteristic of the wide bandgap semiconductor.

Figure 8:
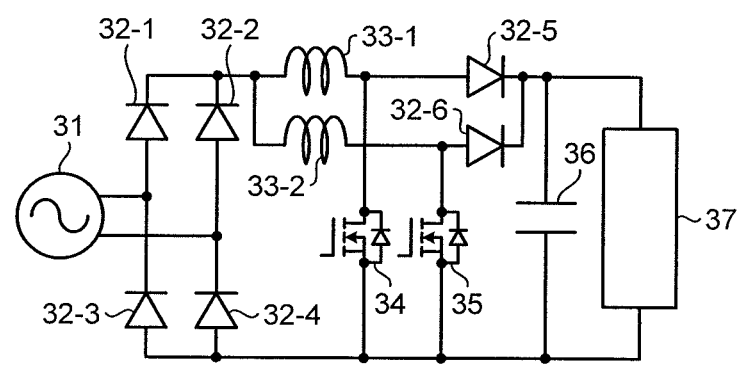
FIG. 8 is a diagram illustrating another configuration example of the power converter.

FIG. 8 is a diagram illustrating another configuration example of the power converter. The power converter illustrated in FIG. 8 is a AC/DC converting apparatus that includes an AC power supply 31, diodes 32-1 to 32-6, coils 33-1 and 33-2, switching elements 34 and 35, a smoothing capacitor 36, and a load 37. The power converter in FIG. 8 can be used instead of the power converter 9 in FIG. 1.

Figure 9:
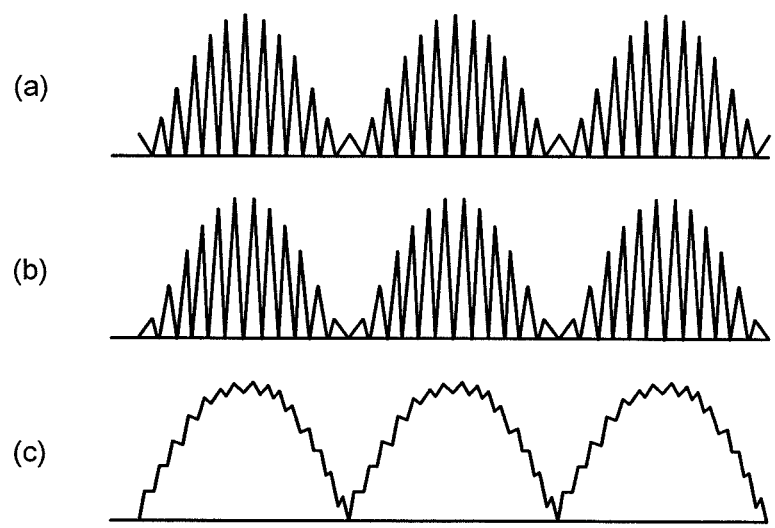
FIG. 9 is a diagram illustrating one example of waveforms of switching elements in the configuration example in FIG. 8.

The AC/DC converting apparatus in FIG. 8 causes the phases of the two switching elements 34 and 35 to be inverted relative to each other to operate with the waveform as illustrated in FIG. 9, thereby reducing the ripple current due to switching. FIG. 9(a) illustrates an example of a current waveform by the operation of the switching element 34 in FIG. 8 and FIG. 9(b) illustrates an example of a current waveform by the operation of the switching element 35. FIG. 9(c) illustrates a synthesized current waveform of the waveform in FIG. 9(a) and the waveform in FIG. 9(b). The waveforms are synthesized; therefore, the ripple becomes double of that in the operations of the switching elements 34 and 35; therefore, it is equivalent of the operation being performed with a half period.

Accordingly, the operation is performed at a high speed as in the case of using a wide bandgap semiconductor, and a current ripple at twice the frequency of the switching elements flows toward the AC power supply, which can be handled by using a small choke coil or the like. Therefore, the effect on equipment instruments, such as a transformer, can be reduced. Although two switching elements are illustrated in FIG. 8, the number of switching elements is not limited to two and may be three or more. When the number of switching elements is n, this configuration can be realized without departing from the above effect by causing the switching elements to operate with a phase difference of 360/n relative to each other.

Figure 10:
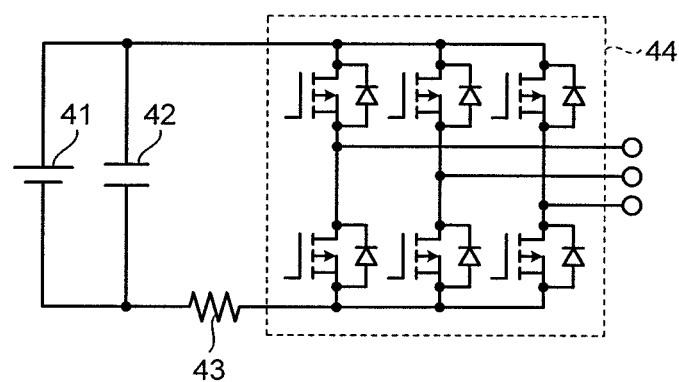
FIG. 10 is a diagram illustrating still another configuration example of the power converter.

FIG. 10 is a diagram illustrating still another configuration example of the power converter. The power converter illustrated in FIG. 10 includes a power supply 41, a smoothing capacitor 42, a resistor 43, and a switching unit 44. The switching unit 44 includes six switching elements. In the power converter having such a configuration, when a wide bandgap semiconductor is used for the switching elements, the noise can be reduced without impairing the characteristics of the wide bandgap semiconductor by driving the switching elements using the drive device 15 described above. This is because, when the wide bandgap semiconductor is used, the noise is generated due to ringing caused by the LC resonance between the equivalent capacitance of the wide bandgap semiconductor and the wiring inductance and therefore the mechanism is different from the mechanism of noise generation due to the recovery current caused by reverse recovery as in the conventional cited example.

As described above, in the present embodiment, the on-speed reducing unit 13, which makes the change at the rising and immediately before the end of the transition time gradual when the drive signal is turned on, and the off-speed improving unit 14, which draws charge at a high speed when the drive signal is turned off, are provided. Therefore, when the power converter is driven by performing high-speed switching using a wide bandgap semiconductor, ringing at the time of turn-on and turn-off can be suppressed.

INDUSTRIAL APPLICABILITY

As described above, the drive device for the power converter according to the present invention is suitable for a power converter for which a wide bandgap semiconductor can be used, i.e., for a device that drives a power converter, such as for AC-DC conversion, DC-DC conversion, DC-AC conversion, and AC-AC conversion. Particularly, the drive device for the power converter according to the present invention provides a drive device that can be used for a converter, an inverter, and the like, and can reduce the noise generated due to high-speed switching while realizing energy saving by using a wide bandgap semiconductor. The drive device for the power converter according to the present invention can be used in general home appliances, such as refrigerators, dehumidifiers, heat pump water heaters, showcases, and vacuum cleaners, in addition to air conditioners, freezers, and washer-dryers, and can also be used in fan motors, ventilation fans, hand dryers, electromagnetic induction heating cookers, and the like. Furthermore, the drive device for the power converter according to the present invention can be used in motor drive inverters for industrial equipment, such as elevators and escalators, motor drive inverters for factory equipment, inverters for electric railways, and electric vehicles and hybrid vehicles, in addition to the home appliances.

The invention claimed is:

1. A drive device for a power converter, the drive device driving the power converter that includes a switching element formed from a wide bandgap semiconductor, the device comprising:
   a PWM-signal output unit that generates a first drive signal for driving the switching element with PWM;
   an on-speed reducing unit that outputs a second drive signal to the switching element in response to the first drive signal and that includes a resistor, a capacitor, a waveform generating unit, a comparator, and an AND circuit; and
   an off-speed improving unit that, when the switching element is changed from on to off, draws charge from the switching element with a charge drawing performance higher than when the switching element is changed from off to on, wherein
   a leading edge of the second drive signal, for turning on the switch element, includes a first change rate, a second change rate, and a third change rate, and
   the second change rate, between the first and third change rate, is larger than the first and third change rates.

2. The drive device for a power converter according to claim 1, wherein
   the on-speed reducing unit generates the second drive signal such that a ringing that occurs due to an LC resonance due to an equivalent capacitance of the switching element is suppressed.

3. The drive device for a power converter according to claim 1, wherein
   the off-speed improving unit causes charge stored in an equivalent capacitance of the switching element to be discharged in response to a change of the switching element from on to off.

4. The drive device for a power converter according to claim 1, wherein
   when the switching element is changed from on to off, the off-speed improving unit draws charge such that an amount of charge transfer is larger than that when the switching element is changed from off to on.

5. The drive device for a power converter according to claim 1, wherein
   the power converter includes a plurality of the switching elements and the switching elements are driven with phases that are different relative to each other.

6. The drive device for a power converter according to claim 1, wherein
   the power converter is a DC/AC power converter to which an inductive load is connected as a load.

7. The drive device for a power converter according to claim 6, wherein
   the power converter controls a compressor.

8. The drive device for a power converter according to claim 1, wherein
   the leading edge of the second drive signal is changed continuously so that the drive signal changes smoothly.

9. The drive device for a power converter according to claim 1, wherein the on-speed reducing unit and the off-speed improving unit are configured to suppress ringing from the wiring inductance components and stray capacitances at the time of turn-on and turn-off of the switching element formed from the wide bandgap semiconductor.

10. The drive device for a power converter according to claim 1, wherein the on-speed reducing unit includes a low-pass filter.

11. The drive device for a power converter according to claim 10, wherein the low-pass filter includes the resistor, the inductor, and the capacitor.

12. The drive device for a power converter according to claim 1, wherein
   the capacitor and the resistor are connected to both a noninverting terminal of the comparator and an input of the AND circuit,
   the waveform generating unit is connected to an inverting terminal of the comparator, and
   an output of the comparator is connected to an input of the AND circuit.

13. The drive device for a power converter according to claim 1, wherein
   the PWM-signal output unit is electrically connected to the on-speed reducing unit and the off-speed improving unit, and the on-speed reducing unit and the off-speed reducing unit are electrically connected to the switching element.

14. The drive device for a power converter according to claim 1, further comprising a gate driving unit, wherein
   the PWM-signal output unit is electrically connected to the gate driving unit, the gate driving unit is electrically connected to the on-speed reducing unit and the off-speed improving unit, and the on-speed reducing unit and the off-speed reducing unit are electrically connected to the switching element.

15. A driving method of a power converter for driving the power converter that includes a switching element formed from a wide bandgap semiconductor, the method comprising:
- a PWM-signal outputting step of generating a drive signal that drives the switching element with PWM;
- an on-speed reducing step of outputting a second drive signal from an on-speed reducing unit includes a resistor, a capacitor, a waveform generating unit, a comparator, and an AND circuit to the switching element in response to the first drive signal; and
- an off-speed improving step of, when the switching element is changed from on to off, drawing charge from the switching element with a charge drawing performance higher than when the switching element is changed from off to on, wherein
- a leading edge of the second drive signal, for turning on the switch element, includes a first change rate, a second change rate, and a third change rate, and
- the second change rate, between the first and third change rate, is larger than the first and third change rates.

* * * * *

UNITED STATES PATENT AND TRADEMARK OFFICE
CERTIFICATE OF CORRECTION

PATENT NO. : 9,806,594 B2  
APPLICATION NO. : 14/355634  
DATED : October 31, 2017  
INVENTOR(S) : Yosuke Shinomoto et al.

Page 1 of 1

It is certified that error appears in the above-identified patent and that said Letters Patent is hereby corrected as shown below:

On the Title Page

Correct assignee in item (73) to read as follows:  
MITSUBISHI ELECTRIC CORPORATION Signed and Sealed this  
Second Day of January, 2018

Joseph Matal  
*Performing the Functions and Duties of the*  
*Under Secretary of Commerce for Intellectual Property and*  
*Director of the United States Patent and Trademark Office*